(12) United States Patent
Hammi

(10) Patent No.: US 8,897,728 B2
(45) Date of Patent: Nov. 25, 2014

(54) METHOD FOR MEMORY EFFECTS QUANTIFICATION AND COMPARISON IN RF TRANSMITTERS AND AMPLIFIERS

(71) Applicant: King Fahd University of Petroleum and Minerals, Dhahran (SA)

(72) Inventor: Oalid Hammi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 95 days.

(21) Appl. No.: 13/873,135

(22) Filed: Apr. 29, 2013

(65) Prior Publication Data

US 2014/0323067 A1    Oct. 30, 2014

(51) Int. Cl.
*H03C 1/62* (2006.01)
*H04B 1/04* (2006.01)
*H04B 1/02* (2006.01)

(52) U.S. Cl.
CPC .................................. *H04B 1/02* (2013.01)
USPC ............... 455/115.1; 455/114.3; 375/296; 375/297; 330/256; 330/266

(58) Field of Classification Search
USPC ............ 455/63.1, 67.13, 114.2, 114.3, 115.1; 375/296, 297; 330/256, 266
See application file for complete search history.

(56) References Cited

U.S. PATENT DOCUMENTS

| 6,674,808 | B1 * | 1/2004 | Griph et al. ................... 375/285 |
| 7,035,345 | B2 * | 4/2006 | Jeckeln et al. ................ 375/296 |
| 7,469,491 | B2 * | 12/2008 | McCallister et al. ......... 375/296 |
| 8,605,819 | B2 * | 12/2013 | Lozhkin ........................ 375/297 |
| 8,611,459 | B2 * | 12/2013 | McCallister ............... 455/114.3 |
| 2004/0201422 | A1 | 10/2004 | Goss |
| 2006/0240786 | A1 | 10/2006 | Liu |
| 2007/0120606 | A1 | 5/2007 | Lee et al. |
| 2008/0057882 | A1 | 3/2008 | Singerl et al. |

OTHER PUBLICATIONS

Vycore: http://www.vyycore.com/what is memory effect, retrieved from the Internet on (Nov. 21, 2012).

* cited by examiner

*Primary Examiner* — Quochien B Vuong
(74) *Attorney, Agent, or Firm* — Richard C. Litman

(57) ABSTRACT

The method for memory effects quantification and comparison in RF transmitters and amplifiers is a method in which a processor performs a spectrum analysis of an RF transmitter or RF amplifier device under test (DUT). The processor then calculates a normalized frequency ($f_n$) according to the relation:

$$f_n = \frac{f - f_c}{BW}.$$

The processor then utilizes the normalized frequency calculation in a spectrum asymmetry index (SAI) computation characterized by the relation:

$$SAI = \frac{1}{K} \sum_{f_n=f_{n,start}}^{f_n=f_{n,stop}} |P(f_n) - P(-f_n)|.$$

Next, utilizing the absolute value of the normalized frequency according to the relation:

$$|f_n| = \left|\frac{f - f_c}{BW}\right|,$$

the processor displays the calculated SAI and causes a display device to display a mirrored spectrum as a function of the absolute value of the normalized frequency around a zero frequency. The resulting plot and calculated SAI displays reveal the degree of memory effects a given DUT exhibits. Similarly produced display plots among various DUTs can be quantitatively compared utilizing the method's SAI metric.

3 Claims, 9 Drawing Sheets

METHOD FOR MEMORY EFFECTS QUANTIFICATION AND COMPARISON IN RF TRANSMITTERS AND AMPLIFIERS

BACKGROUND OF THE INVENTION

1. Field of the Invention

The present invention relates to analysis of radio frequency (RF) nonlinear systems with memory effects, and particularly to a method for memory effects quantification and comparison in RF transmitters and amplifiers.

2. Description of the Related Art

Memory effect" is a distortion characteristic that results in having the instantaneous output of a system to depend on its current input as well as a set of finite preceding inputs.

Memory effect can be caused by the thermal operating characteristics of the semiconductor device. In this case, it is referred to as "thermal memory effect". When a high peak-to-average power ratio (PAPR) signal having a narrow bandwidth (in the range of few MHz or less) is being transmitted via power amplifier, the transitory temperature rises very quickly when the peak occurs. Thus, for a couple of microseconds, the temperature of the transistor rises. For example if the peak-to-average power ratio of the signal is 6 dB, the heat generated by the transistor is approximately four times higher than average.

This phenomenon causes the instantaneous gain of the power amplifier to vary as a function of the junction temperature. In other words, the gain at a given instant will be function of the junction temperature, which is, in turn, a function of the power levels of the preceding input samples. That is why it is called "memory effect", because the behavior of the power amplifier is related to the characteristic history of the signal being transmitted. The thermal resistances and thermal capacitances of the semiconductor is a key figure in memory effect.

Memory effect can also be caused by the wideband width of the input signals applied to the power amplifiers or transmitters. In this case, it is commonly labeled as "electrical memory effect". Electrical memory effects are caused by the frequency response of the biasing circuitries and matching networks of the power amplifier at the baseband, around the carrier frequency as well as its harmonics. Electrical memory effects also cause the output of the system to depend on its current as well as preceding status.

Memory effects are very present in modern communication systems, and they significantly impact the performance of the power amplifier and transmitter. They are difficult to compensate, and thus it is very important to be able to measure them and quantify them to guide the design and optimization of the power amplifier and transmitter.

Two memory effects intensity metrics have been previously proposed to quantify memory effects in transmitters and power amplifiers driven by modulated signals. These metrics consist in calculating the power in the adjacent channel after cancellation of the memory-less nonlinearity of the device under test (DUT). One of the techniques requires linearizing the DUT through memory-less predistortion, and then measuring its output signal to calculate the memory effects intensity. The second metric is derived after cancelling the memory-less nonlinearity of the DUT using memory-less postcompensation, and then measuring the obtained output signal to calculate the memory effects intensity. A more direct approach is sought.

Thus, a method for memory effects quantification and comparison in RF transmitters and amplifiers solving the aforementioned problems is desired.

SUMMARY OF THE INVENTION

The method for memory effects quantification and comparison in RF transmitters and amplifiers is a method in which a processor performs a spectrum analysis on the signal at the output of an RF transmitter or RF amplifier device under test (DUT). The processor then calculates a normalized frequency ($f_n$) according to the relation:

$$f_n = \frac{f - f_c}{BW}.$$

The processor then utilizes the normalized frequency calculation to plot the spectrum of the signal and causes a display device to display a mirrored spectrum around a zero frequency. The resulting plot displays an asymmetrical pattern that reveals the degree of memory effects a given DUT exhibits. The spectrum asymmetry index (SAI) computation uses the normalized frequency ($f_n$) and allows for quantitative measurement of the degree of memory effects revealed by the mirrored spectrum plot. The SAI is characterized by the relation:

$$SAI = \frac{1}{K} \sum_{f_n = f_{n,start}}^{f_n = f_{n,stop}} |P(f_n) - P(-f_n)|.$$

where K is the number of frequency terms in the summation. $f_n$ is the normalized frequency, and $f_{n,start}$ and $f_{n,stop}$ are the lower and the upper frequency bounds used for SAI calculation, respectively.

The processor then displays the value of the calculated SAI for any set of specified $f_{n,start}$ and $f_{n,stop}$. Similarly produced display plots among various DUTs can be quantitatively compared utilizing the method's novel SAI metric. The method can be implemented as a valuable feature in commercial spectrum analyzers or other instruments measuring signal spectra.

Typically, the lower bound is set to 0 and the upper bound is set to 2.5 to include frequency components from the in-band and both the third and the fifth order intermodulation distortions. Both bounds can be customized to quantify the SAI in a specific region of the spectrum. In particular, the upper bound can also be set to 1.5 in order to only include third order intermodulation products, or in general, to N/2 to include $N^{th}$ order intermodulation products.

Similarly produced mirrored spectrum display plots among various DUTs can be quantitatively compared utilizing the method's novel SAI metric. The method can be implemented as a valuable feature in commercial spectrum analyzers or other instruments measuring signal spectra, or in software tools performing spectra plotting and analysis.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The method for memory effects quantification and comparison in RF transmitters and amplifiers is a method in which a spectrum asymmetry index (SAI) is calculated from the measured spectrum at the output of an RF emitting device under test (DUT). The SAI can be used as an effective metric in quantifying memory effects on RF transmitters and amplifiers.

At the outset, it should be understood by one of ordinary skill in the art that embodiments of the present method can comprise software or firmware code executing on a computer, a microcontroller, a microprocessor, or a DSP processor; state machines implemented in application specific or programmable logic; or numerous other forms without departing from the spirit and scope of the present method. The present method can be provided as a computer program, which includes a non-transitory machine-readable medium having stored thereon instructions that can be used to program a computer (or other electronic devices) to perform a process according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

Figure 7:
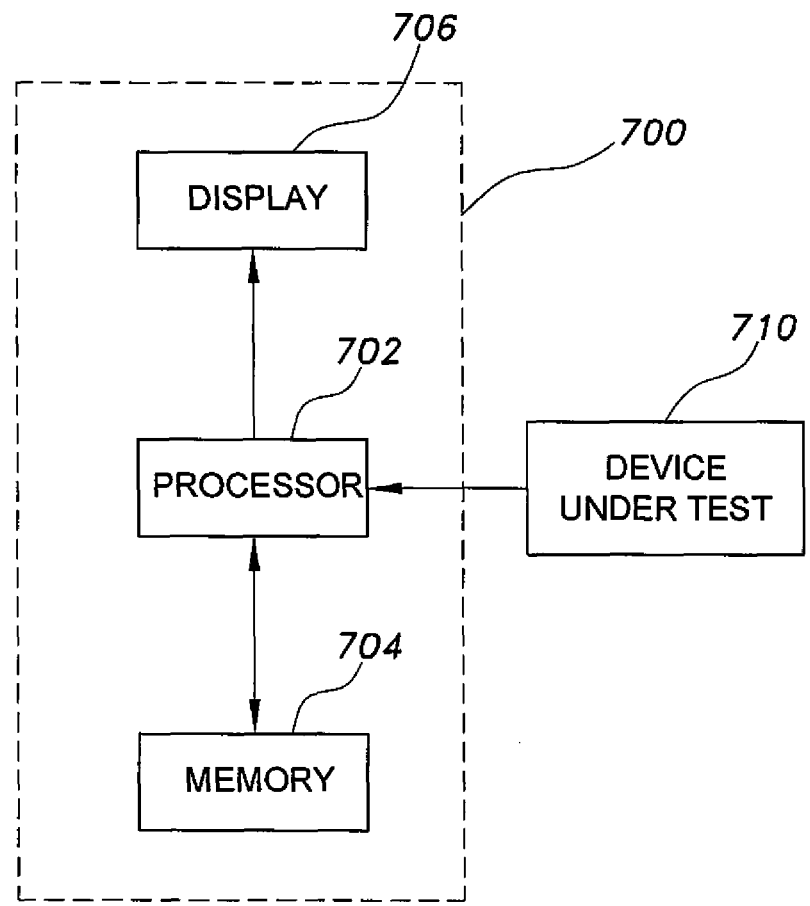
FIG. 7 is a block diagram showing an analyzer capable of executing the method for memory effects quantification and comparison in RF transmitters and amplifiers according to the present invention.

Results of the present method show that the Spectrum Asymmetry Index can be used to compare the intensity of memory effects in different prototypes. This metric is useful for transmitter and especially power amplifier designers, as it enables them to estimate the memory effects from the early design stages. The method can be implemented as a valuable feature in commercial spectrum analyzers or other instruments measuring signal spectra. For example, as shown in FIG. 7, an analyzer 700 may include a display device 706, a memory device 704, and a processor 702 connected to both the display device 706 and the memory device 704. A device under test 710 may be an RF transmitter or RF amplifier and interfaces with the processor 702, which analyzes the spectrum output by the DUT 710 utilizing the present memory effects quantification method.

The spectrum asymmetry index of the present method for memory effects quantification and comparison in RF transmitters and amplifiers quantifies memory effects exhibited by device under test (DUT) 710. This device under test 710 can be a wireless transmitter, a power amplifier or any other electric circuit having similar behavior. The present method can also be used to compare the memory effects of several devices under test. The disclosed spectrum asymmetry index (SAI) provides a quantitative measure of memory effects and is extracted from the measurement of the spectrum at the output of the DUT.

The present memory effects quantification and comparison method first involves utilizing the processor 702 to obtain the spectrum at the output of the device under test 710. The program carrying out this method may be stored in memory 704, which is in operable communication with processor 702. After obtaining the spectrum of DUT 710, the processor 702 calculates a normalized frequency ($f_n$) according to the relation:

$$f_n = \frac{f - f_c}{BW}, \quad (1)$$

where f is the frequency in MHz, $f_c$ is the carrier frequency, and BW is the signal bandwidth in MHz. Subsequently, utilizing the normalized frequency calculation the processor 702 computes the SAI according to the relation:

$$SAI = \frac{1}{K} \sum_{f_n=f_{n,start}}^{f_n=f_{n,stop}} |P(f_n) - P(-f_n)|, \quad (2)$$

where $P(f_n)$ is the power spectrum density of the measured output signal calculated as a function of the normalized frequency $f_n$, K is the number of frequency terms in the summation, and $f_{n,start}$ and $f_{n,stop}$ are the lower and the upper frequency bounds used for SAI calculation, respectively. The lower integration bound of Equation (2), ($f_{n,start}$), can be set to 0, and the upper bound, ($f_{n,stop}$), can be set to 2.5 to include frequency components from the in-band and both the third and the fifth order intermodulation distortions. Both bounds can be customized to quantify the SAI in a specific region of the spectrum. In particular, the upper bound can also be set to 1.5 in order to only include third order intermodulation products, or in general, to N/2 to include $N^{th}$ order intermodulation products. After the SAI is computed, the display device 706 displays its value. The processor 702 utilizes the absolute value of the normalized frequency characterized by the relation:

$$|f_n| = \left| \frac{f - f_c}{BW} \right|, \quad (3)$$

to plot the spectrum as a function of the normalized frequency and cause the display device 706 to display a mirrored spectrum around a zero frequency.

Figure 1A:
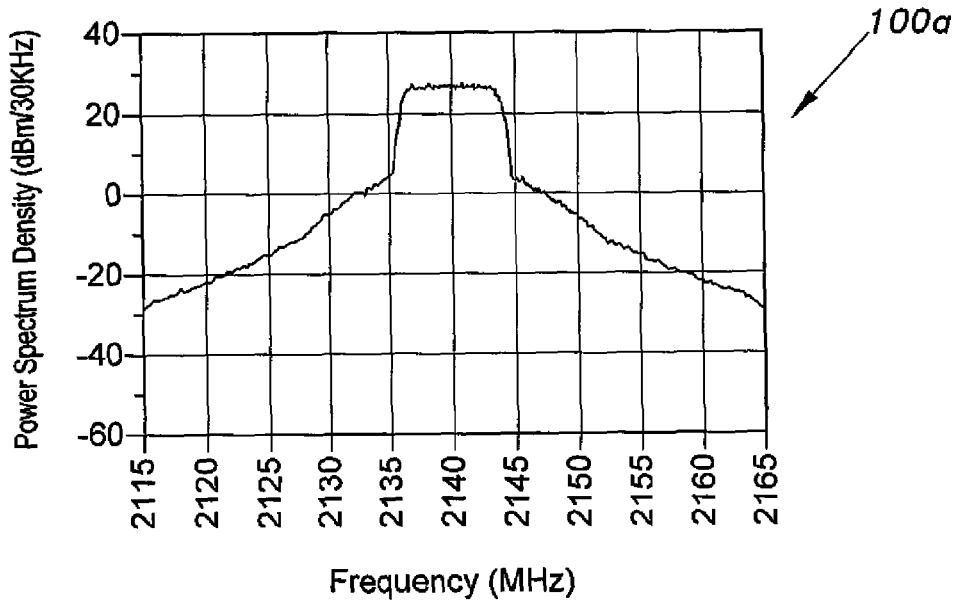
FIG. 1A is a plot showing the spectrum measured using a 10 MHz bandwidth at the output of a power amplifier.
Figure 1B:
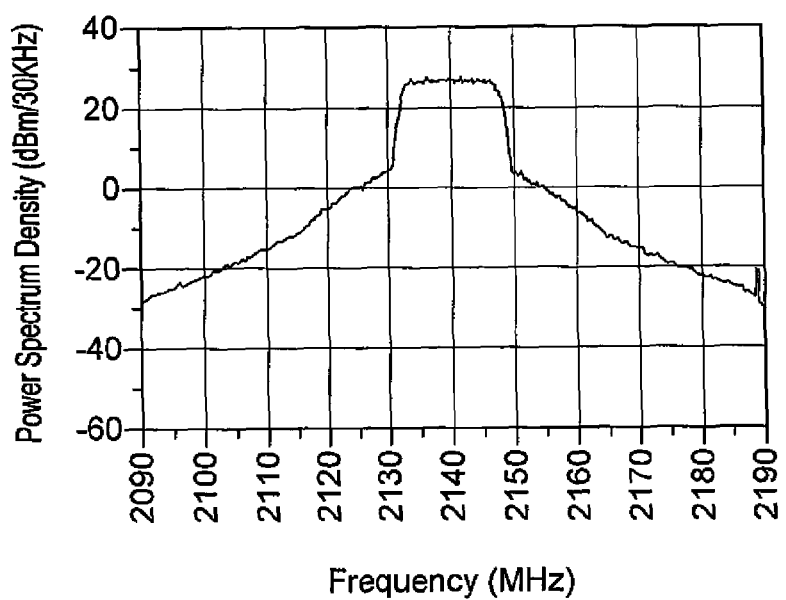
FIG. 1B is a plot showing the spectrum measured using a 20 MHz bandwidth at the output of a power amplifier.
Figure 1C:
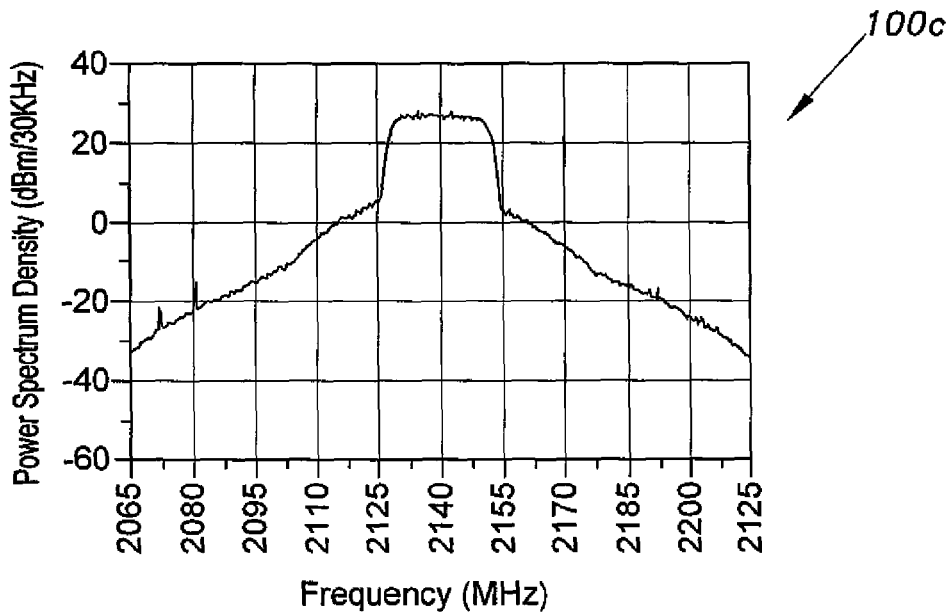
FIG. 1C is a plot showing the spectrum measured using a 30 MHz bandwidth at the output of a power amplifier.
Figure 1D:
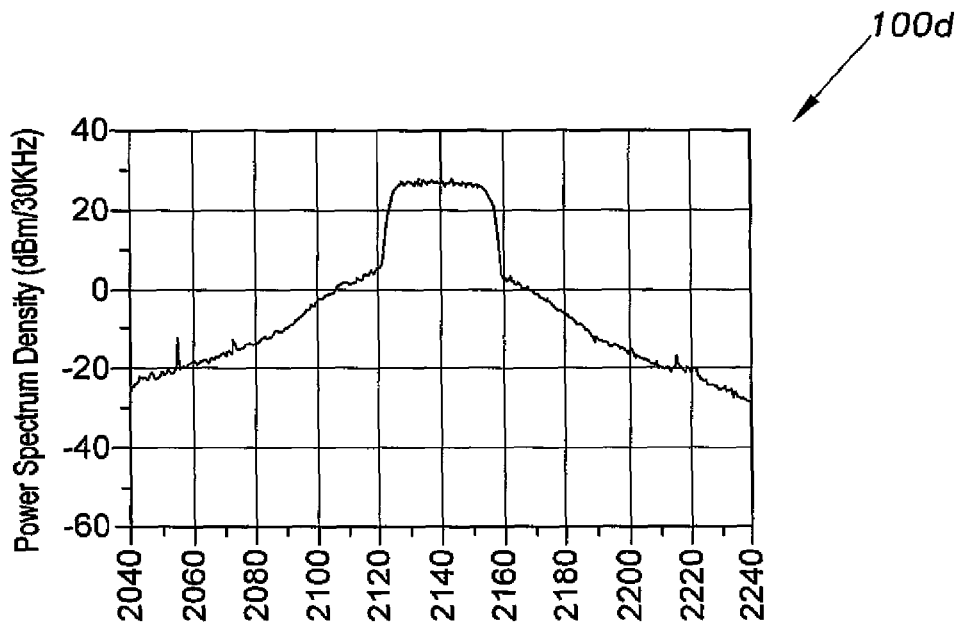
FIG. 1D is a plot showing the spectrum measured using a 40 MHz bandwidth at the output of a power amplifier.
Figure 2:
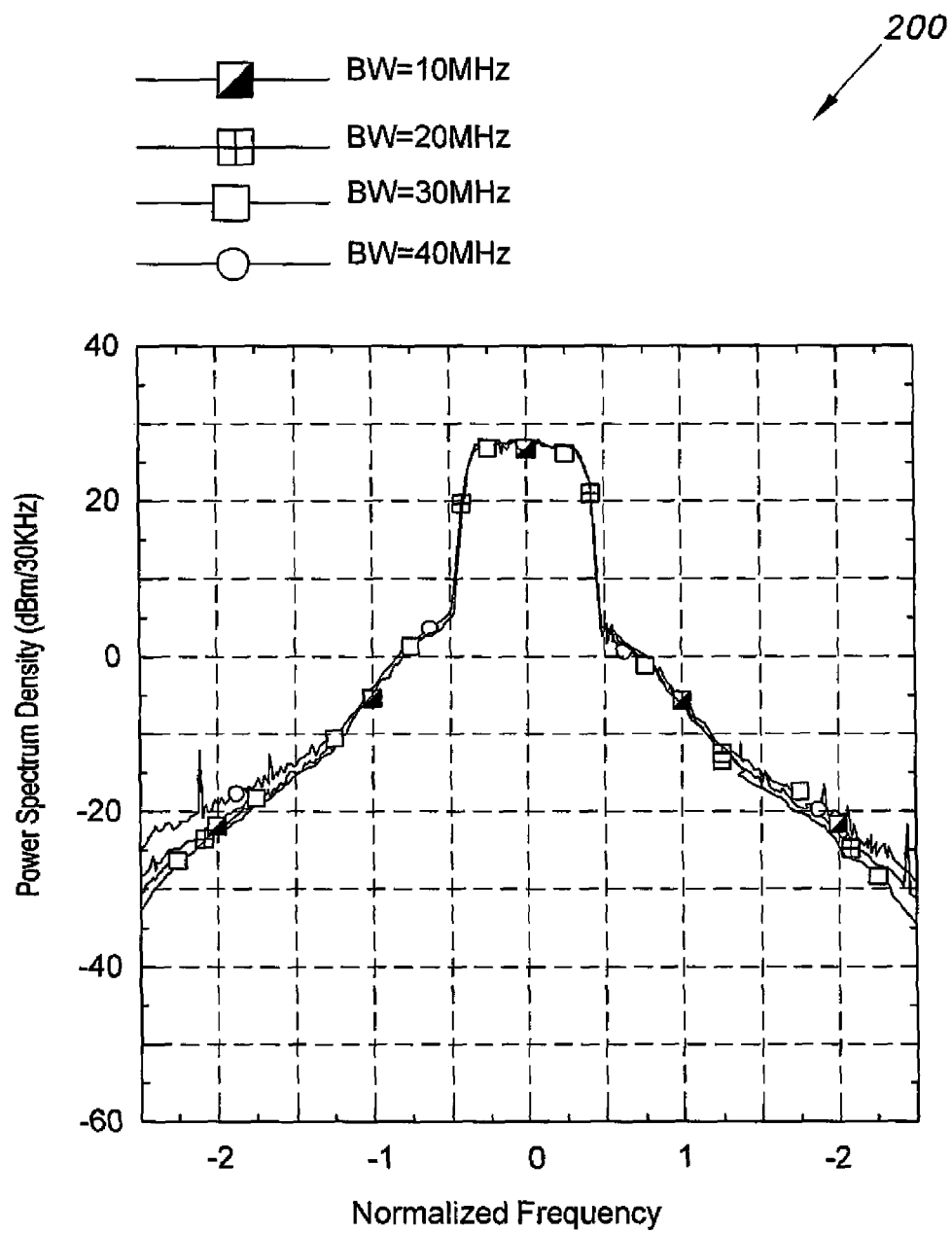
FIG. 2 is a normalized frequency plot showing the spectra measured in FIGS. 1A-1D.
Figure 3A:
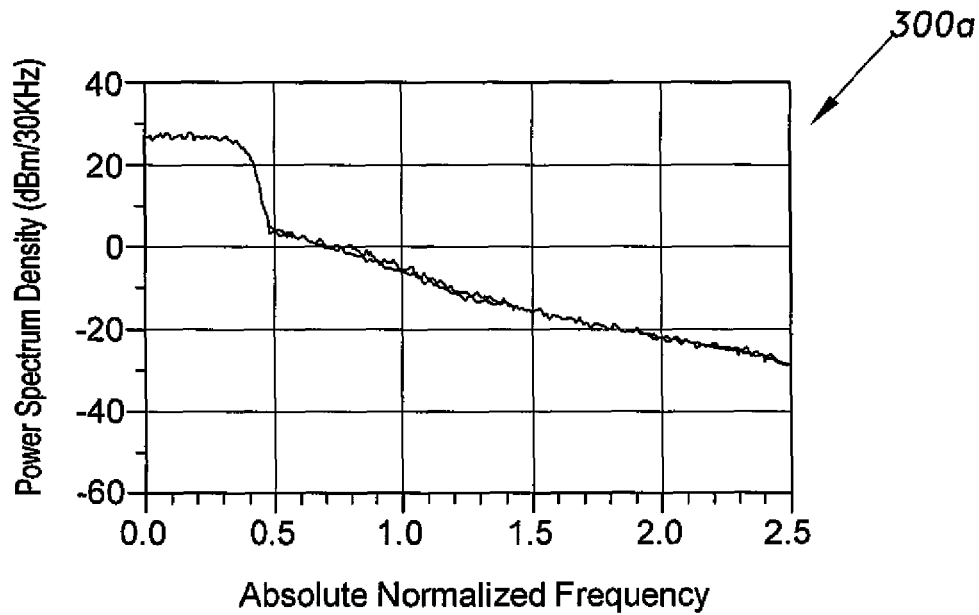
FIG. 3A is an absolute normalized frequency plot showing the spectrum of FIG. 1A.
Figure 3B:
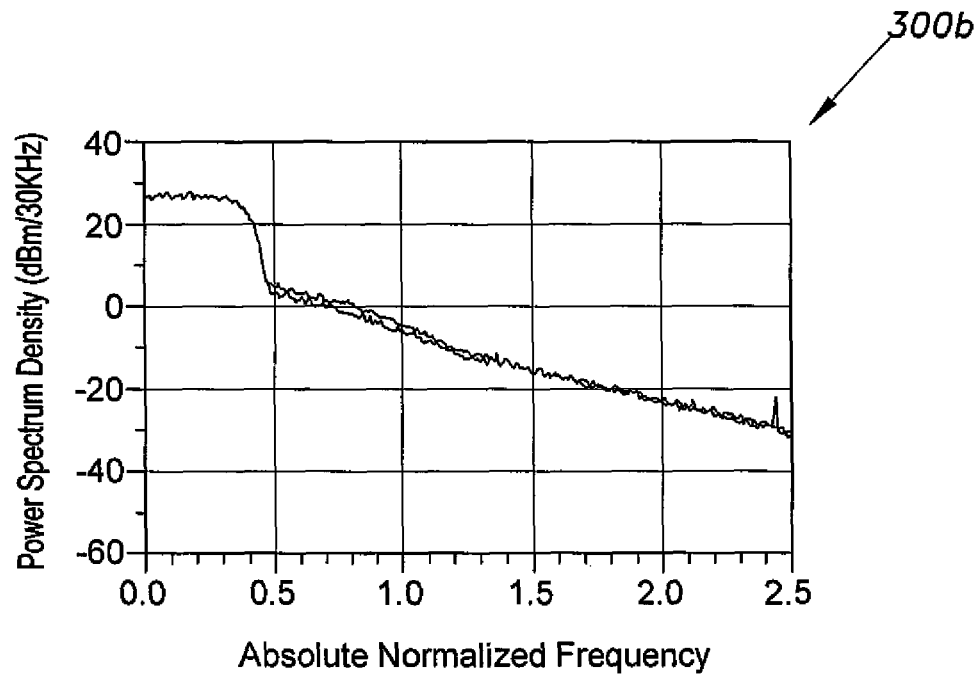
FIG. 3B is an absolute normalized frequency plot showing the spectrum of FIG. 1B.
Figure 3C:
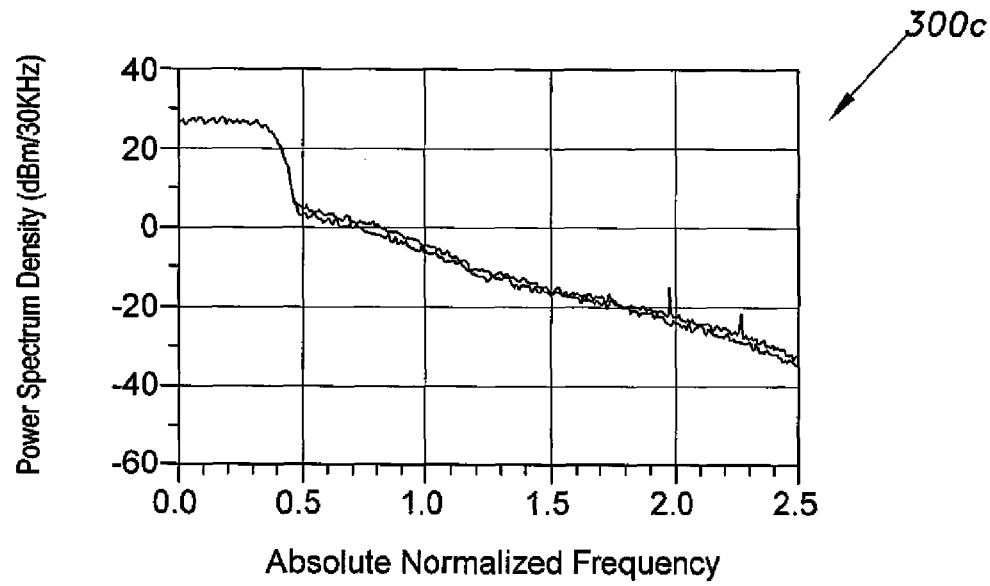
FIG. 3C is an absolute normalized frequency plot showing the spectrum of FIG. 1C.
Figure 3D:
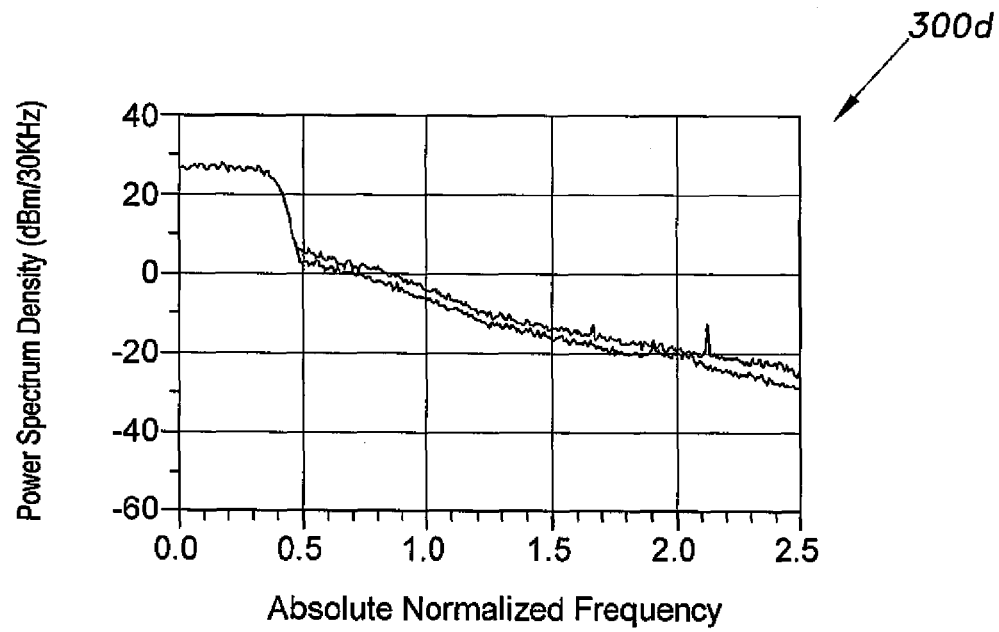
FIG. 3D is an absolute normalized frequency plot showing the spectrum of FIG. 1D.

Spectral data processed by the processor 702 may be displayed as plots using the display device 706. As shown in plots 100a-100d of FIGS. 1A-1D, respectively, the measured spectra at the output of a power amplifier (operating around 2140 MHz) is presented for different input signal bandwidths. The spectra are plotted here as a function of the signal frequency around the RF carrier. In order to compare these curves, the same spectra are plotted in plot 200 of FIG. 2 after normalizing the frequency axis with respect to each signal's bandwidth. This figure shows that the distortions generated by the amplifier seem to be equivalent, since they are mainly dominated by the memory-less distortions. The normalized frequency is defined in the aforementioned Equation (1).

To produce the exemplary plots shown in the Figures, the processor 702 calculates the SAI of equation (2) by plotting the spectra of FIGS. 1A-1D as a function of the normalized frequency and mirroring the spectra around the 0 (zero) frequency, which is 2140 MHz in the results shown in FIGS. 1A-1D. Based on the calculations of the processor 702 utilizing equations (1 through 3), the display device 706 of analyzer 700 displays mirrored versions (shown as plots 300a-300d in FIGS. 3A-3D) of the measured spectra shown in FIGS. 1A-1D at the output of the DUT 710.

For validation of the present memory effects quantification method, the Spectrum Asymmetry Index (SAI) was calculated for two amplifiers: a Doherty power amplifier, and a class AB amplifier. Each device under test was characterized using four test signals (having bandwidths of 10 MHz, 20 MHz, 30 MHz, and 40 MHz) over five average power levels. Thus, for each DUT, results of twenty characterizations are used. For the first set of measurements, the DUTs were driven up to saturation by operating them at an input power back-off that is equal to the signal's peak-to-average power ratio (PAPR). This corresponds to an average input power level of −15.9 dBm and −9.4 dBm for the Doherty Pa. and the class AB PA, respectively. Then, the power level was decreased in steps of 1 dB until −19.9 dBm and −13.4 dBm for the Doherty Pa. and the class AB PA, respectively.

For the Doherty Pa., the SAI was calculated as a function of the input signal's bandwidth (from 10 MHz to 40 MHz) and its average power. The results summarized in plot 400 of FIG. 4 clearly illustrate the robustness and the consistency of the instant method. Indeed, it shows that at constant average power, the SAI increases as a function of the signal bandwidth. This is expected, since the memory effects increase with the input signal's bandwidth. Moreover, at constant signal bandwidth, the SAI decreases as the average input power is reduced, since the PA is driven more into its linear region.

The spectrum asymmetry index was also calculated for the class AB amplifier driven by the same signals. These measurements were also performed at five operating power levels. The SAI values that were calculated for this second DUT are shown in plot 500 of FIG. 5. These results are in line with those observed for the Doherty amplifier in the sense that they indicate increasingly strong memory effects as the signal's bandwidth gets wider for a constant operating average power. Also, at constant signal bandwidth, the spectrum asymmetry index decreases as the operating average power is reduced, since the PA is driven more into its linear region.

Figure 4:
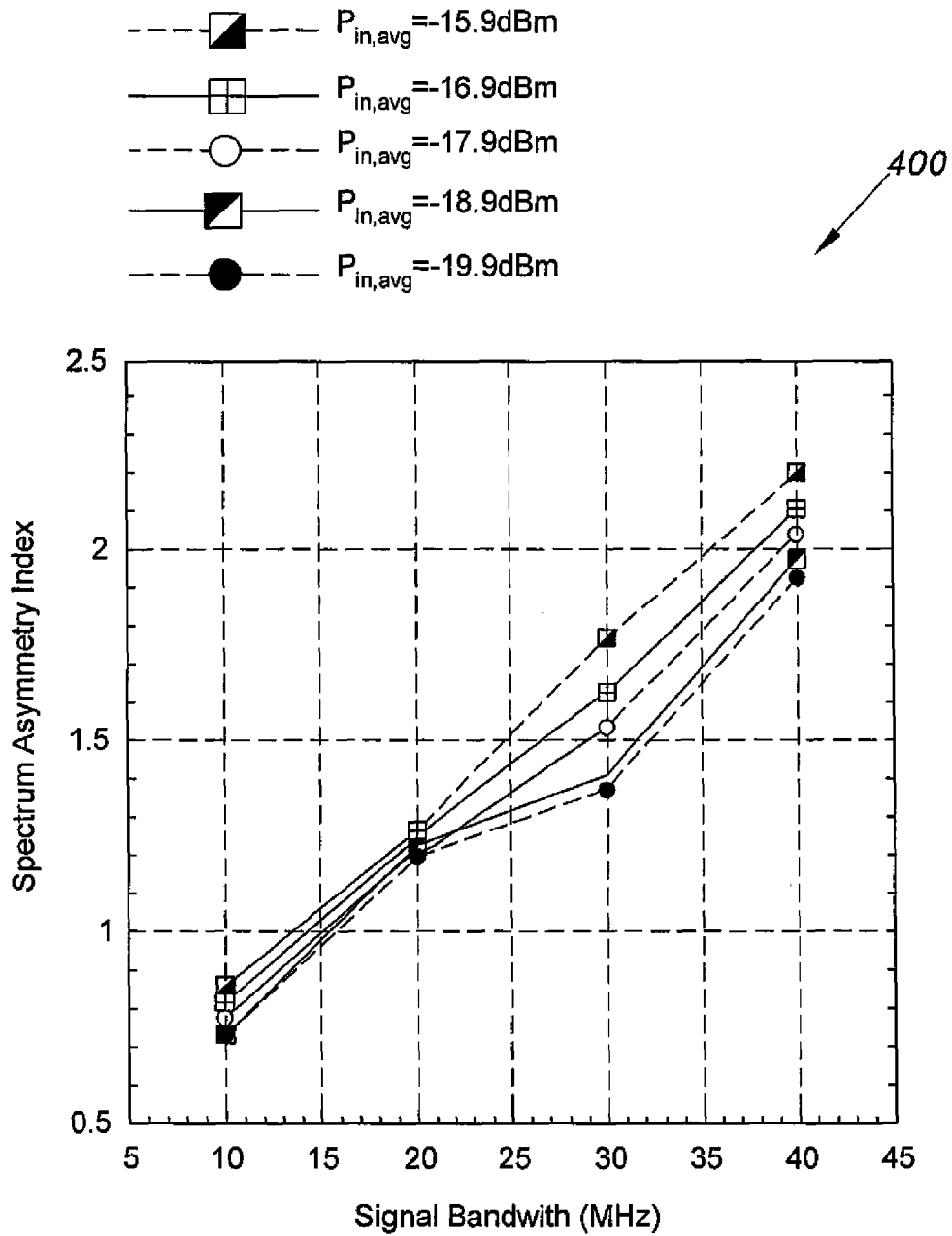
FIG. 4 is a calculated plot showing SAI (spectrum asymmetry index) calculated according to the present invention vs. the signal bandwidth for a first device under test for various average power levels.
Figure 5:
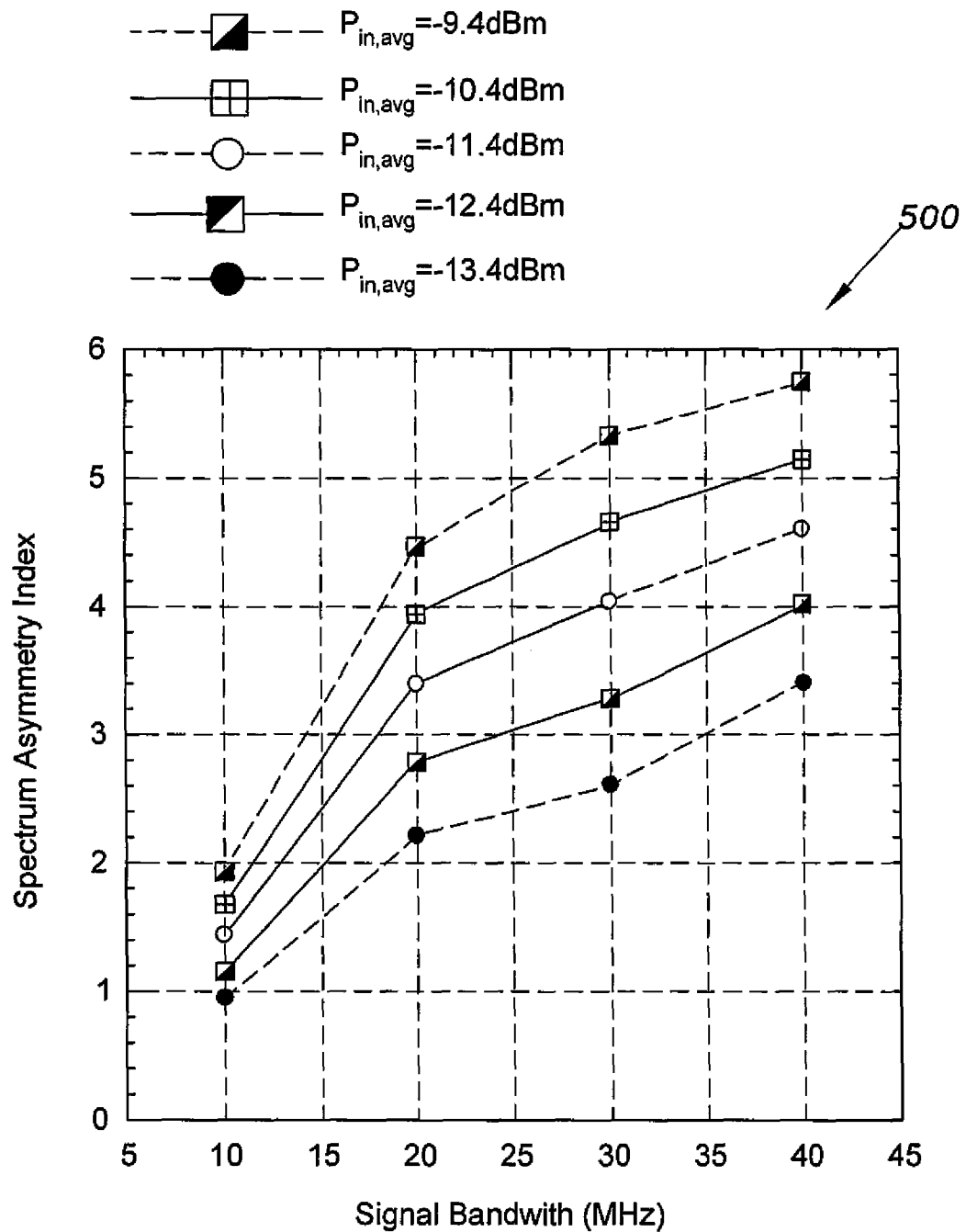
FIG. 5 is a calculated plot showing SAI (spectrum asymmetry index) calculated according to the present invention vs. the signal bandwidth for a different device under test for various average power levels.
Figure 6:
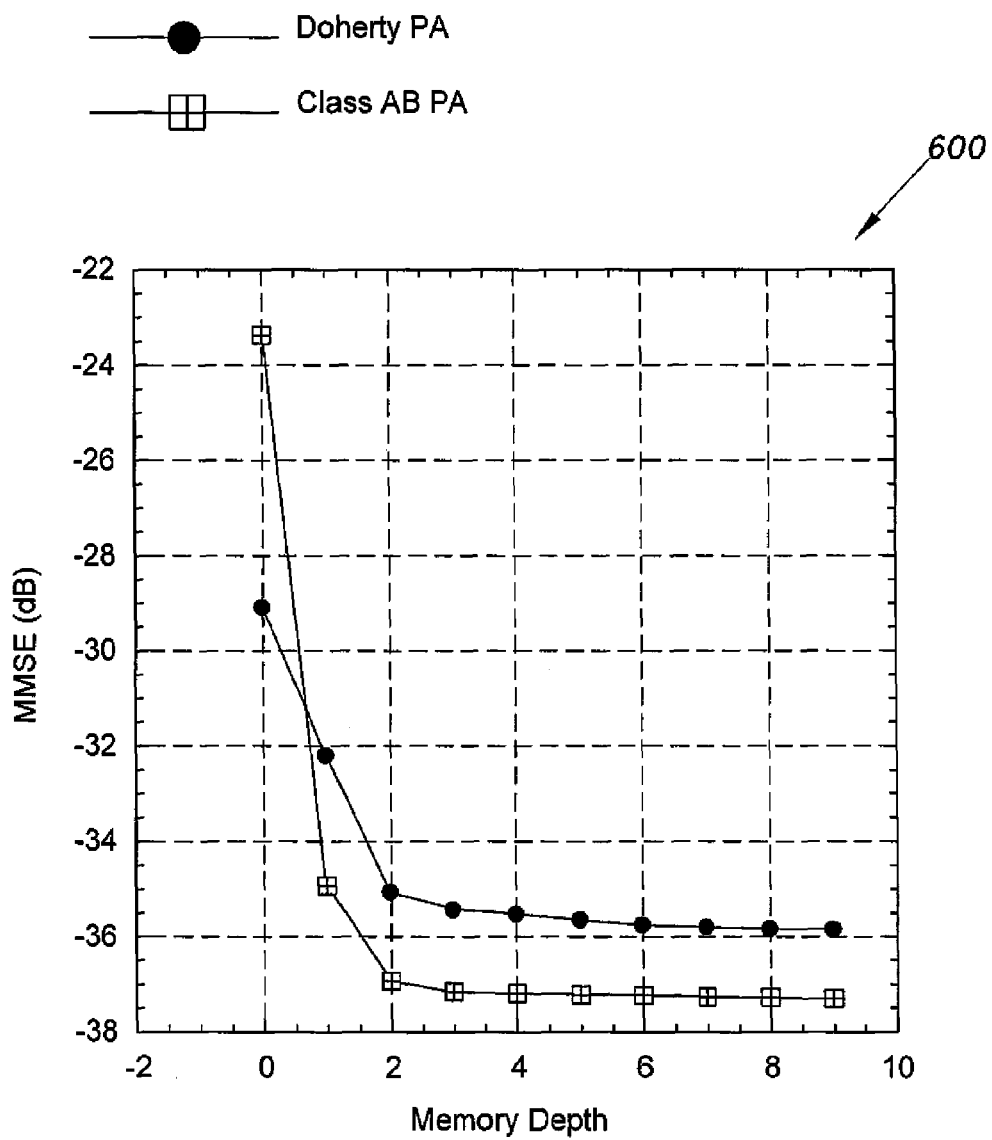
FIG. 6 is a calculated normalized mean squared error (NMSE) of memory polynomial models vs. the memory depth of the model for a class AB and a Doherty power amplifier for a fixed nonlinearity order.

Comparing the results of FIGS. 4 and 5 shows that the SAI values obtained for the class AB amplifier are higher than those obtained for the Doherty amplifier. To further verify the validity of these results, memory polynomial-based behavioral models were generated for both DUTs when driven at peak power (−15.9 dBm for the Doherty Pa., and −9.4 dBm for the class AB PA) with the 40 MHz wide signal. For each amplifier, the memory polynomial model had a nonlinearity order of 12 and a variable memory depth ranging from 0 to 9 (i.e., a variable number of branches ranging from 1 to 10). A memory depth of 0 corresponds to a memory-less polynomial, and a memory depth of 9 corresponds to a memory polynomial having 10 branches. The NMSE obtained for each model were calculated, and are shown in plot 600 of FIG. 6. The plot 600 of FIG. 6 clearly shows that for the Doherty Pa., including memory effects in the model improves the NMSE by approximately 7 dB (from −29 dB to −36 dB). However, when memory effects are considered, the NMSE improves by approximately 14 dB (from −23.5 dB to −37.5 dB) in the case of the class AB amplifier. This corroborates the findings highlighted by the proposed SAI metric, according to which the memory effects of the class AB DUT are stronger than that of the Doherty Pa. Thus, the instant memory effects quantification method can be effectively used to compare the memory effects in several DUT prototypes.

According to the data analysis presented herein, the proposed SAI is a robust metric that can be used to quantify memory effects intensity of transmitters and/or power amplifiers. It can also be used to compare the strength of memory effects exhibited by several prototypes.

In addition to its reliability, the SAI is significantly easier to implement than previously proposed memory effects intensity metrics. In fact, the SAI can be calculated directly from the measured output spectrum without requiring the synthesis of either a memory-less predistortion function or a memory-less post-compensation function for the cancellation of the static nonlinearity. Thus, the SAI can be effectively and easily used to quantify the memory effects of a transmitter and/or power amplifier prototype by the designer, who may not have access to linearization tools. It can also be easily implemented in general purpose instruments.

It is to be understood that the present invention is not limited to the embodiments described above, but encompasses any and all embodiments within the scope of the following claims.

I claim:

1. A computer software product, comprising a non-transitory medium readable by a processor, the medium having stored thereon a set of instructions for quantifying memory effects and comparison in RF transmitters and amplifiers, the set of instructions including:

(a) a first sequence of instructions which, when executed by the processor, causes said processor to perform a spectrum analysis of an RF emitter device under test (DUT);

(b) a second sequence of instructions which, when executed by the processor, causes said processor to calculate a normalized frequency ($f_n$) according to the relation:

$$f_n = \frac{f - f_c}{BW},$$

where f is the frequency in MHz, $f_c$ is the carrier frequency, and BW is the signal bandwidth in MHz;

(c) a third sequence of instructions which, when executed by the processor, causes said processor to calculate a spectrum asymmetry index (SAI) characterized by the relation:

$$AI = \frac{1}{K} \sum_{f_n=f_{n,start}}^{f_n=f_{n,stop}} |P(f_n) - P(-f_n)|,$$

where $P(f_n)$ is the power spectrum density of the measured output signal, $f_n$ is the normalized frequency, K is the number of frequency terms in the summation, and $f_{n,start}$ and $f_{n,stop}$ are the lower and the upper frequency bounds used for SAI calculation, respectively;
  (d) a fourth sequence of instructions which, when executed by the processor, causes said processor to display the calculated SAI; and
  (e) a fifth sequence of instructions which, when executed by the processor, causes said processor to display a mirrored spectra comprised of said calculated SAI around a zero frequency utilizing the absolute value of said normalized frequency according to the relation:

$$|f_n| = \left|\frac{f - f_c}{BW}\right|,$$

where $f_n$ is the normalized frequency, f is the frequency in MHz, $f_c$ is the carrier frequency, and BW is the signal bandwidth in MHz.

2. A computer-implemented method for memory effects quantification and comparison in RF transmitters and amplifiers, comprising the steps of:
  performing a spectrum analysis of an RF emitter device under test (DUT);
  calculating a normalized frequency ($f_n$) according to the relation:

$$f_n = \frac{f - f_c}{BW},$$

where f is the frequency in MHz, $f_c$ is the carrier frequency, and BW is the signal bandwidth in MHz;
  calculating a spectrum asymmetry index (SAI) characterized by the relation:

$$SAI = \frac{1}{K} \sum_{f_n=f_{n,start}}^{f_n=f_{n,stop}} |P(f_n) - P(-f_n)|,$$

where $P(f_n)$ is the power spectrum density of the measured output signal, $f_n$ is the normalized frequency; K is the number of frequency terms in the summation, and $f_{n,start}$ and $f_{n,stop}$ are the lower and the upper frequency bounds used for SAI calculation, respectively;
  displaying the calculated SAI; and
  displaying a mirrored spectrum as a function of the normalized frequency around a zero frequency utilizing the absolute value of the normalized frequency according to the relation:

$$|f_n| = \left|\frac{f - f_c}{BW}\right|,$$

where $f_n$ is the normalized frequency, f is the frequency in MHz, $f_c$ is the carrier frequency, and BW is the signal bandwidth in MHz.

3. A system for memory effects quantification and comparison in RF transmitters and amplifiers, comprising:
  means for performing a spectrum analysis of an RF emitter device under test (DUT);
  means for calculating a normalized frequency ($f_n$) according to the relation:

$$f_n = \frac{f - f_c}{BW},$$

where f is the frequency in MHz, $f_c$ is the carrier frequency, and BW is the signal bandwidth in MHz;
  means for calculating a spectrum asymmetry index (SAI) characterized by the relation:

$$SAI = \frac{1}{K} \sum_{f_n=f_{n,start}}^{f_n=f_{n,stop}} |P(f_n) - P(-f_n)|,$$

where $P(f_n)$ is the power spectrum density of the measured output signal, $f_n$ is the normalized frequency, K is the number of frequency terms in the summation, and $f_{n,start}$ and $f_{n,stop}$ are the lower and the upper frequency bounds used for SAI calculation, respectively;
  means for displaying the calculated SAI; and
  means for displaying a mirrored spectrum as a function of the normalized frequency around a zero frequency utilizing the absolute value of the normalized frequency according to the relation:

$$|f_n| = \left|\frac{f - f_c}{BW}\right|,$$

where $f_n$ is the normalized frequency, f is the frequency in MHz, $f_c$ is the carrier frequency, and BW is the signal bandwidth in MHz.

\* \* \* \* \*